United States Patent
Mozak et al.

(10) Patent No.: US 10,373,948 B2
(45) Date of Patent: Aug. 6, 2019

(54) ON-DIE SYSTEM ELECTROSTATIC DISCHARGE PROTECTION

(71) Applicant: Intel Corporation, Santa Clara, CA (US)

(72) Inventors: Christopher P. Mozak, Beaverton, OR (US); Victor Zia, Portland, OR (US); Gabriel J. Thompson, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 346 days.

(21) Appl. No.: 15/203,296

(22) Filed: Jul. 6, 2016

(65) Prior Publication Data

US 2018/0012886 A1 Jan. 11, 2018

(51) Int. Cl.
*H02H 9/04* (2006.01)
*H01L 27/02* (2006.01)

(52) U.S. Cl.
CPC ...... *H01L 27/0281* (2013.01); *H01L 27/0255* (2013.01); *H02H 9/046* (2013.01)

(58) Field of Classification Search
CPC .. H01L 27/0255; H01L 27/0281; H02H 9/046
USPC .......................................................... 361/56
See application file for complete search history.

(56) References Cited

U.S. PATENT DOCUMENTS

| 5,623,387 A * | 4/1997 | Li | H01L 27/0251 |
| | | | 257/355 |
| 2005/0264964 A1* | 12/2005 | Coronel | H01L 27/0248 |
| | | | 361/56 |
| 2008/0001655 A1* | 1/2008 | Pham | G06F 1/3203 |
| | | | 327/544 |
| 2008/0074813 A1* | 3/2008 | Wertheimer | H02H 9/046 |
| | | | 361/56 |
| 2009/0195944 A1 | 8/2009 | Goyal et al. | |
| 2009/0323234 A1 | 12/2009 | Bach | |
| 2011/0026176 A1 | 2/2011 | Kim | |
| 2013/0163129 A1 | 6/2013 | Lai et al. | |
| 2013/0308234 A1 | 11/2013 | Hyvonen et al. | |
| 2014/0089705 A1* | 3/2014 | Man | G06F 1/3275 |
| | | | 713/323 |

FOREIGN PATENT DOCUMENTS

WO      2018009299      1/2018

OTHER PUBLICATIONS

"International Application Serial No. PCT/US2017/036390, International Search Report dated Oct. 30, 2017", 3 pgs.
"International Application Serial No. PCT/US2017/036390, Written Opinion dated Oct. 30, 2017", 8 pgs.

* cited by examiner

*Primary Examiner* — Kevin J Comber
(74) *Attorney, Agent, or Firm* — Schwegman Lundberg & Woessner, P.A.

(57) ABSTRACT

Some embodiments include apparatus and methods using a first transistor coupled between a node and a supply node, a second transistor coupled between the node and a ground node, an electrostatic discharge (ESD) protection unit including a diode coupled between the node and an additional node, and a transistor coupled between the additional node and the supply node.

19 Claims, 6 Drawing Sheets

ON-DIE SYSTEM ELECTROSTATIC DISCHARGE PROTECTION

TECHNICAL FIELD

Embodiments described herein pertain to integrated circuit (IC) devices and systems. Some embodiments relate to electrostatic discharge (ESD) protection in such devices and systems.

BACKGROUND

In electronic devices and systems (e.g., IC chip, cellular phones, and computers), an ESD event occurs when a relatively high electrostatic charge built-up in an object (or in human) is transferred to the device or system through direct contact or, in some cases, through air. The voltage associated with such an ESD event can be in the range of thousands of kilovolts. This high voltage can damage the device and system. Therefore, many devices and systems have ESD protection circuitry to protect them from ESD events. ESD protection has traditionally been divided into component level ESD protection and system level ESD protection. Component level ESD protection focuses on protecting the device (e.g., IC chip) during manufacturing (or during handling) while the device is unpowered. System ESD protection focuses on protecting signals exposed outside devices in the system (e.g., signals on a connector, such as a Universal Serial Bus (USB) or SDCard connector) while the system is powered (e.g., operating). System ESD protection usually includes support for hot plugging external components (e.g., USB components and SDCards) while the system is powered. Many traditional system ESD protection techniques use expensive, discrete components on the circuit board of the system. For some applications, such techniques may increase cost and may affect signal integrity.

DETAILED DESCRIPTION

As mentioned above, component level ESD protection focuses on protecting the device while it is unpowered. Thus, some traditional component ESD protection circuitry of a device may operate poorly or may even fail to operate when an ESD event occurs while the device is powered. This may damage the device.

The technique described herein relates to component and system ESD protection. The described technique includes an IC having an ESD protection unit that allows integrating system ESD support on the same die with other circuits of the IC. The described technique enables component level ESD protection to efficiently function while the IC is powered. The described technique potentially eliminates the need for system level ESD protection. This may save cost in comparison with some traditional component and system ESD protection. Other improvements and benefits are described below.

Figure 1:
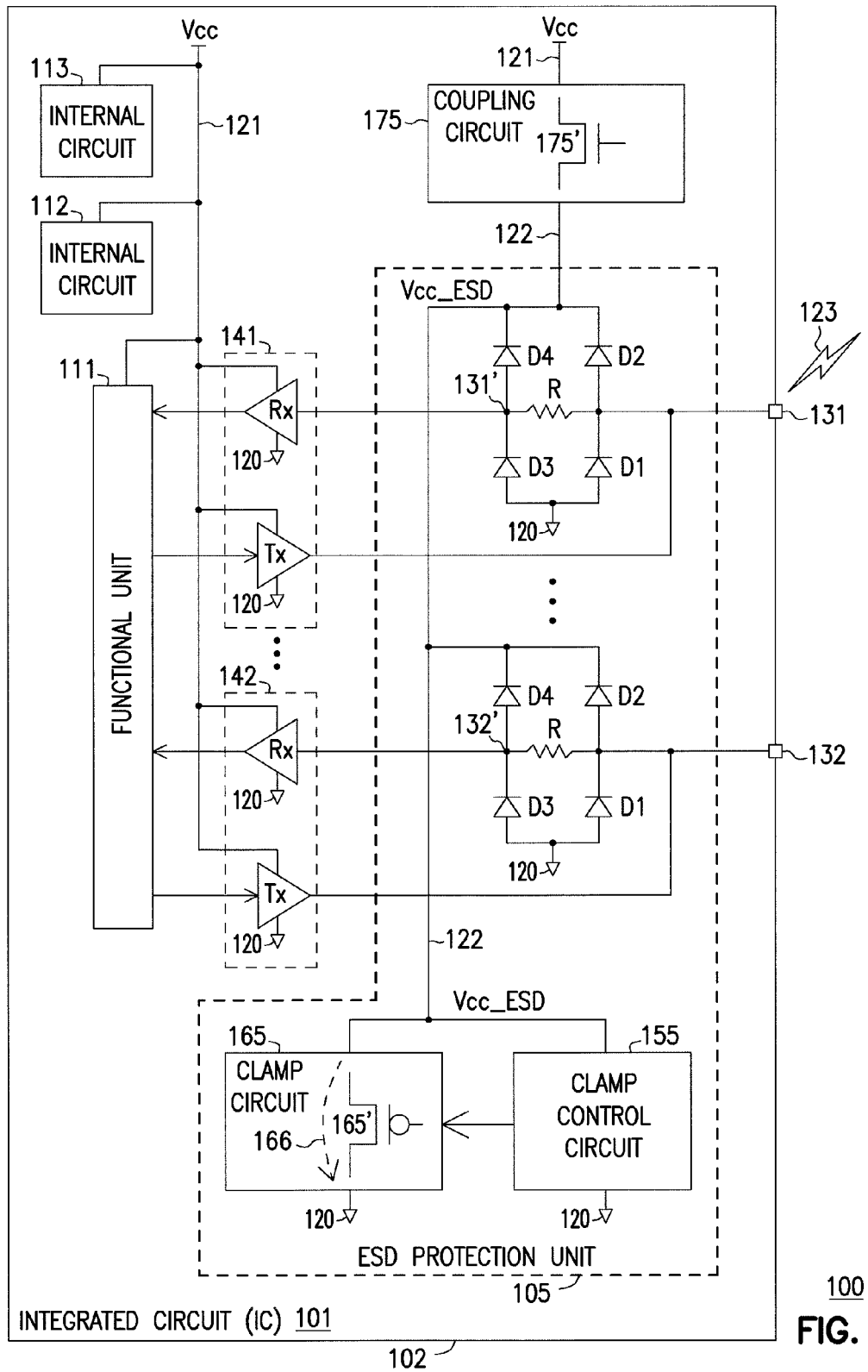
FIG. 1 shows an apparatus including an IC having an ESD protection unit, according to some embodiments described herein.

FIG. 1 shows an apparatus 100 including an IC 101 having an ESD protection unit 105, according to some embodiments described herein. Apparatus 100 can include or be included in an electronic device or system, such as a computer (e.g., desktop, laptop, or notebook), a tablet, a cellular phone, or other electronic devices or systems. IC 101 can include a processor, a memory device, a system on chip (SoC), or other electronic devices or systems. IC 101 can include a semiconductor die (e.g., a silicon die) 102. Circuit components of ESD protection unit 105 can be located on (e.g., formed in or formed on) the same die (e.g., semiconductor die 102) with other circuitry of IC 101.

IC 101 can include a ground node 120 and a supply node 121 that can be coupled to (or part of) supply rails of IC 101. For example, ground node 120 can be coupled to supply rail Vss. Supply node 121 can be coupled to a supply rail 121' (e.g., Vcc supply rail) of IC 101.

IC 101 can include a functional unit 111, and internal circuits 112 and 113 that can be coupled to supply node 121 and use voltage Vcc as supply voltage for their operations. Functional unit 111 of IC 101 can include components (e.g., circuits and logic) of a processor (e.g., to process information, such as data), a memory device (e.g., to store information), or both. Internal circuits 112 and 113 can be other circuits of IC 101, such as circuits included in a processor (e.g., a central processing unit (CPU)).

IC 101 can include nodes 131 and 132, each of which can be an input/output (I/O) node of IC 101 to carry a signal (e.g., output signal) transmitted by IC 101 (to another device) or a signal (e.g., input signal) received by IC 101 (sent to IC from another device). Node 131 can include (or can be part of) an I/O pad (or I/O pin) of IC 101. Node 132 can include (or can be part of) another I/O pad (or I/O pin) of IC 101.

IC 101 can include I/O driver circuits 141 and 142, each of which can include a transmitter Tx and a receiver Rx. Transmitter Tx and receiver Rx of each of driver circuits 141 and 142 can be coupled to ground node 120 and supply node 121. In each of driver circuits 141 and 142, transmitter Tx can include an output node coupled to a respective I/O node (e.g., node 131 or 132), and receiver Rx can include an input node coupled to a respective I/O node through a resistor R.

IC 101 can use each of driver circuits 141 and 142 as an I/O driver circuit (e.g., I/O buffer circuit) to transmit and receive signals through a corresponding I/O node of IC 101. For example, IC 101 can use transmitter Tx of driver circuit 141 to transmit an output signal from functional unit 111 to another device through node 131. IC 101 can use receiver Rx of driver circuit 141 to receive an input signal from another device through node 131. Similarly, IC 101 can use transmitter Tx of driver circuit 142 to transmit an output signal from functional unit 111 to another device through node 132. IC 101 can use receiver Rx of driver circuit 142 to receive an input signal from another device through node 132.

FIG. 1 shows IC 101 including two driver circuits 141 and 142 and two associated nodes 131 and 132, as an example. The number of driver circuits and associated nodes (e.g., I/O nodes) of IC 101 can vary.

As shown in FIG. 1, IC 101 can include a node 122. Node 122 is an additional node different from (e.g., separated from) supply node 121. Node 122 can have a voltage Vcc_ESD.

Figure 2:
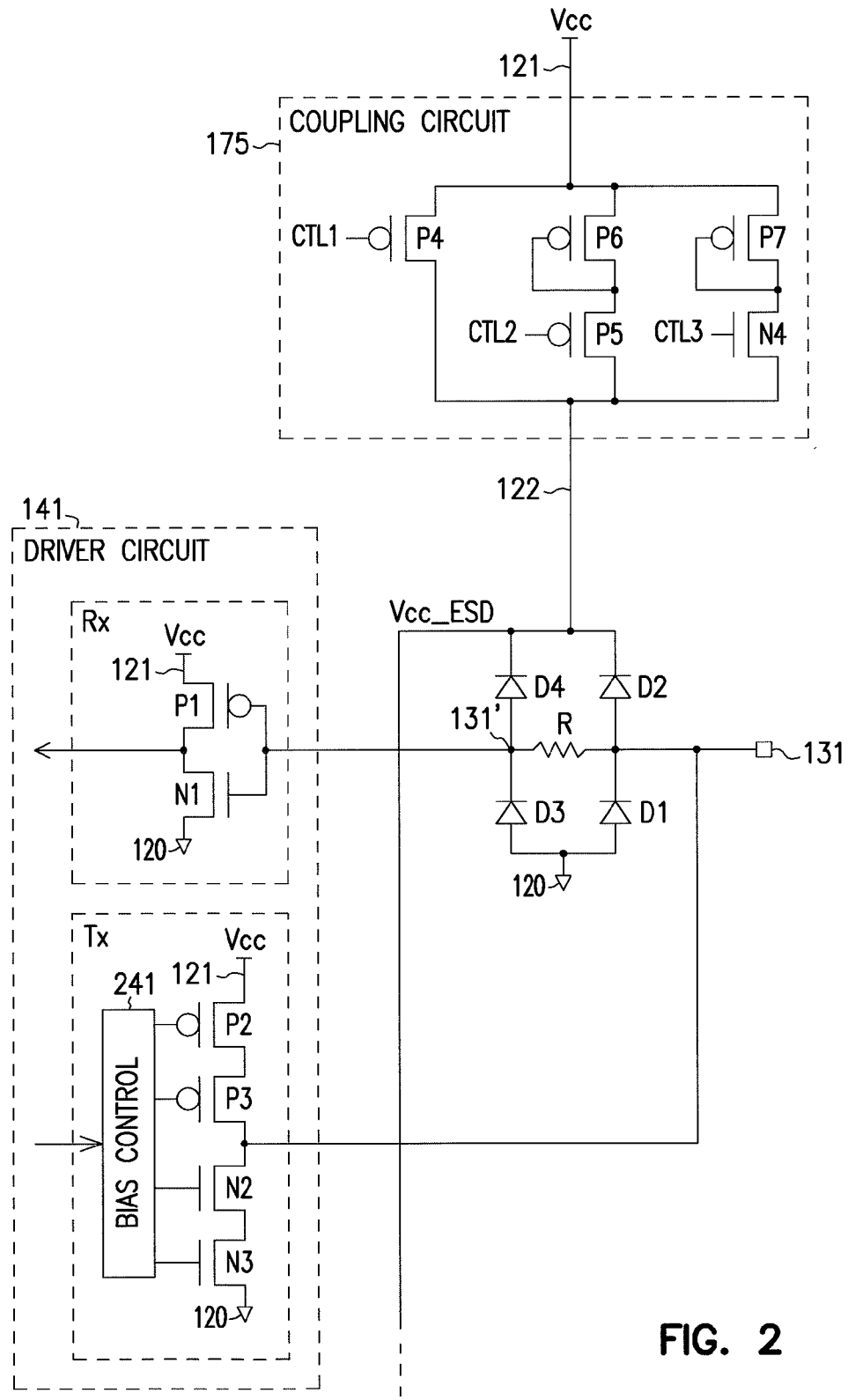
FIG. 2 shows a schematic diagram of a driver circuit (including a receiver Rx and a transmitter Tx), a coupling circuit, and a portion of the ESD protection unit of the IC of FIG. 1, according to some embodiments described herein.

IC 101 can include a coupling circuit 175 located between node 122 and supply node 121. Coupling circuit 175 can include a transistor 175' that can form a circuit path between node 122 and supply node 121. Coupling circuit 175 can control transistor 175' to set a value for voltage Vcc_ESD during a normal operation of IC 101. An example of coupling circuit 175 is shown in FIG. 2 (described in detail below).

As shown in FIG. 1, ESD protection unit 105 can include a set of diodes D1, D2, D3, and D4 coupled to nodes 131 and 131', and another set of diodes D1, D2, D3, and D4 coupled to nodes 132 and 132'. ESD protection unit 105 can include a clamp control circuit 155 coupled between node 122 and ground node 120, and a clamp circuit 165 coupled between node 122 and ground node 120. FIG. 1 shows an example of four diodes D1, D2, D3, and D4 associated with an I/O node (e.g., node 131 or 132). Alternatively, diodes D3 and D4 can be omitted from ESD protection unit 105.

Diode D1, D4, or both can operate to protect IC 101 from a high negative voltage (e.g., a negative voltage in kilovolts range) caused by an ESD event. For example, when a negative voltage ESD event (e.g., ESD event 123) occurs at node 131, diode D1 at node 131 can form a circuit path between ground node 120 and node 131. This allows current (ESD current) to flow from ground node 120 to node 131, thereby protecting IC 101 from damage that may be caused by the negative voltage ESD event.

Diodes D2 and D4 and clamp circuit 165 can operate to protect IC 101 from a high positive voltage (e.g., a positive voltage in kilovolts range) caused by an ESD event. For example, when a positive voltage ESD event (e.g., ESD event 123) occurs at node 131, clamp circuit 165 can turn on and form a circuit path between node 131 and ground node 120 through diode D2 and clamp circuit 165. This allows current (ESD current) to flow from node 131 to ground node 120, thereby protecting IC 101 from damage that may be caused by the positive voltage ESD event.

Figure 3:
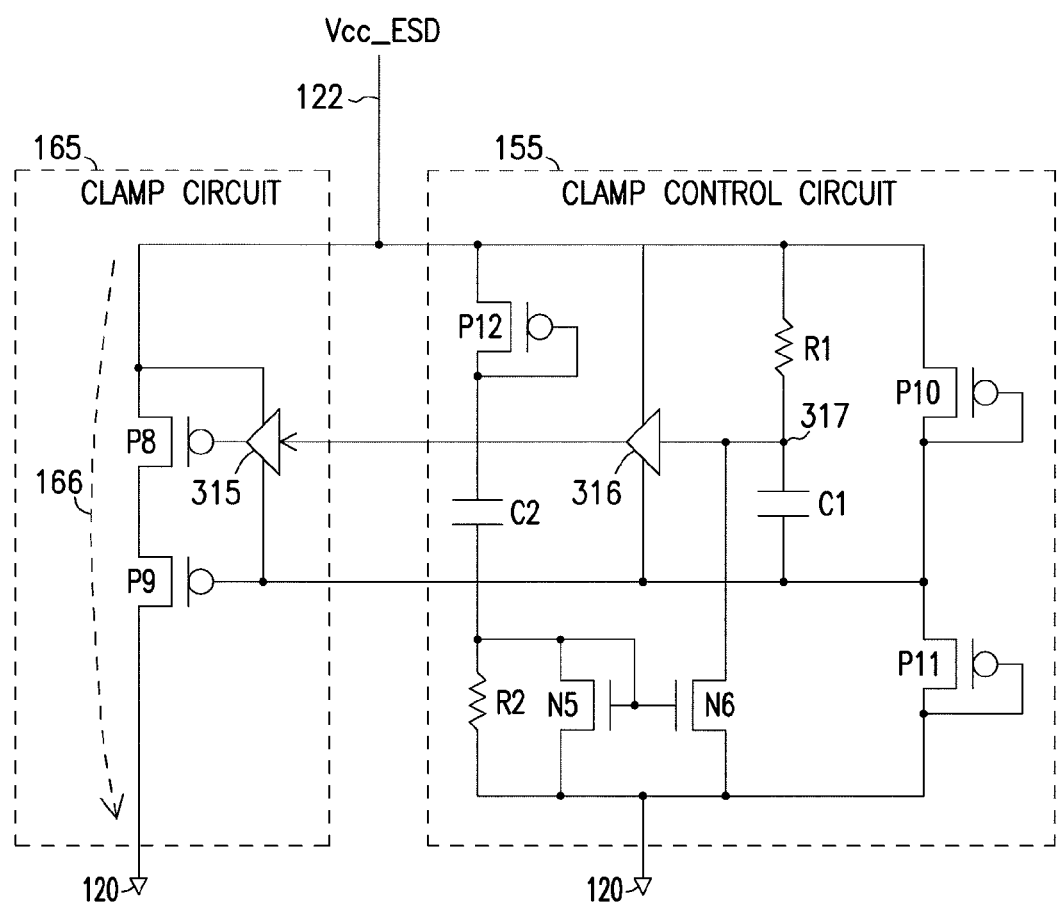
FIG. 3 shows a schematic diagram of a clamp circuit and a clamp control circuit of the ESD protection unit of FIG. 1, according to some embodiments described herein.

As shown in FIG. 1, clamp circuit 165 can include a transistor (e.g., transistor 165') that can turn on to form a circuit path 166. Clamp control circuit 155 can include an RC timer (e.g., a resistor and capacitor network) to control the switching of transistor 165' based on the time constant of the RC timer. An example of clamp control circuit 155 and clamp circuit 165 is shown in FIG. 3 (described in detail below).

Configuring (e.g., arranging) ESD protection unit 105 and creating node 122 (an additional node separated from supply node 121) as shown in FIG. 1 may allow the ESD protection unit 105 to provide IC 101 with component level ESD protection and system level ESD protection. For example, I/O circuits (subject to system ESD), such as driver circuits 141 and 142 of IC 101, may share supply voltage from the supply rail (Vcc supply rail) with other circuits (e.g., internal circuits 112 and 113). During operations of IC 101 (or when IC 101 is powered), other circuits (internal circuits 112 and 113) of IC 101 can continue to operate if a system ESD event occurs (e.g., due to a hot plug of an external device) on the I/O circuits of the system (e.g., a system that includes IC 101). Some traditional ESD protection techniques may use a clamp circuit to short a particular supply rail (e.g., Vcc supply rail) of a system to ground during an ESD event. This may cause the other circuits sharing that particular supply rail of that system to fail.

ESD protection unit 105 of FIG. 1 has a structure different from some traditional ESD protection structures and operates in a different way. As shown in FIG. 1, node 122 is separated from supply node 121, such that node 122 can be a "floating" node during an ESD event. This means that during an ESD event (e.g., ESD event 123) at node 131, diode D2 and D4 diodes at node 131 are still directly coupled to a circuit path between node 122 and node 131 to allow the clamping operations. However, since node 122 is separated from supply node 121, node 122 is not directly coupled to supply rail 121'. Instead, node 122 (which has voltage Vcc_ESD) is allowed to "float" such that such an ESD event may only impact the node (e.g., node 131 or 132) where the ESD event occurs. Other nodes (and supply rail 121') and other circuits (internal circuits 112 and 113) of IC 101 are safe from the ESD event.

FIG. 2 shows a schematic diagram of driver circuit 141 (including receiver Rx and transmitter Tx), and coupling circuit 175 of IC 101 of FIG. 1, and a portion of ESD protection unit 105, according to some embodiments described herein. For simplicity, only components (e.g., transistors) of driver circuit 141 are shown in FIG. 2. Driver circuit 142 of IC 101 (FIG. 1) can have similar components as driver circuit 141. In FIG. 2, diodes D1, D2, D3, and D4 and resistor R are the same as those shown in FIG. 1.

As shown in FIG. 2, receiver Rx of driver circuit 141 can include transistors P1 and N1 coupled between nodes 131' and supply node 121. The gate of each of transistors P1 and N1 can be coupled to node 131 through resistor R to receive a signal (e.g., input signal). Transmitter Tx of driver circuit 141 can include transistors P2 and P3 coupled between nodes 131 and supply node 121, and transistors N2 and N3 coupled between nodes 131 and ground node 120. The source of transistor P3 and the drain of transistor N2 can be coupled to (e.g., directly coupled to) node 131 to provide an output signal to node 131. Transistors P2, P3, N2 and N3 can be controlled by a bias control portion 241. Each of transistors P1, P2 and P3 can include a field effect transistor (FET), such as a p-channel metal-oxide semiconductor (PMOS) transistor. Each of transistors N1, N2, and N3 can include a FET, such as an n-channel metal-oxide semiconductor (NMOS) transistor.

FIG. 2 shows an example where receiver Rx and transmitter Tx have certain transistors and certain circuit connections. However, receiver Rx and transmitter Tx can have a different number of transistors and circuit connections, as long as receiver Rx can operate to receive a signal (e.g., input signal) from node 131, and transmitter Tx can operate to transmit (e.g., drive) a signal (e.g., output signal) at node 131.

Coupling circuit 175 can include transistors P4, P5, P6, P7, and N4. Coupling circuit 175 can receive signals (e.g., control signals) CTL1, CTL2, and CTL3 to form different circuit paths between node 122 and supply node 121 at different times, depending on operating modes of IC 101. For example, during one operating mode of IC 101, coupling circuit 175 can couple node 122 to supply node 121 by using signal CTL1 to turn on transistor P4 (e.g., while transistors P5 and N4 are turned off) and form a circuit path between node 122 and supply node 121 through transistor P4. During another operating mode of IC 101, coupling circuit 175 can couple node 122 to supply node 121 by using signal CTL2 to turn on transistor P5 (e.g., while transistors P4 and N4 are turned off) and form a circuit path between node 122 and supply node 121 through transistors P5 and P6. During a further operating mode of IC 101, coupling circuit 175 can couple node 122 to supply node 121 by using signal CTL3 to turn on transistor N4 (e.g., while transistors P4 and P5 are turned off) to form a circuit path between node 122 and supply node 121 through transistors N4 and P7.

Different circuit paths (mentioned above) between node 122 and supply node 121 can have different impedances (e.g., different resistances). Thus, during normal operations of IC 101, voltage Vcc_ESD on node can have different values, depending the operating modes of IC 101.

For example, during an operating mode (e.g., transmit or receive mode) where IC 101 transmits signals to or receives signals from nodes 131 and 132, the signals at nodes 131 and 132 may toggle between different voltage levels. Such voltage levels may include a high voltage level (e.g., $V_{OH}$) and a low voltage level (e.g., $V_{OL}$) that may correspond to different values (logic 1 and logic 0, respectively) of information carried by the signals at nodes 131 and 132. During the operating mode in this example, voltage Vcc_ESD can be provided with a value (e.g., high voltage level $V_{OH}$) such that forward bias currents on diodes D2 and D4 can be prevented. This can also prevent fast I/O edges rates from changing the value of voltage Vcc_ESD so quickly that it may accidently turn on clamp circuit 165 (FIG. 1). In this example, coupling circuit 175 can use signal CLT2 to turn on transistor P5 and form a circuit path through transistors P5 and P6, such that voltage Vcc_ESD can be provided with a value of approximately Vcc–Vth (e.g., $V_{OH}$ level) where Vt is the threshold voltage of transistor P5.

In another example, during low power modes of IC 101, voltage Vcc_ESD can be provided with a relatively lower value (e.g., approximately 1V) to save leakage power. In this example, coupling circuit 175 can use signal CLT3 to turn on transistor N4 and form a circuit path between node 122 and supply node 121 through transistors N4 and P7, such that voltage Vcc_ESD can be provided with the relatively lower value.

In another example, during a power ramp stage of IC 101, voltage Vcc_ESD can be provided with a relative higher value (e.g., approximately the value of voltage Vcc). In this example, coupling circuit 175 can use signal CLT1 to turn on transistor P3 and form a circuit path between node 122 and supply node 121 through transistors P4, such that voltage Vcc_ESD can be provided with a value of approximately Vcc.

By creating node 122 (which is separate from supply node 121) and by placing coupling circuit 175 between node 122 and supply node 121 (e.g., between node 122 and Vcc supply rail), node 122 may have no low impedance path to supply node 121 (e.g., to Vcc supply rail). This also prevents voltage Vcc_ESD on node 122 from causing excessive noise or droop on supply rail 121' (e.g., Vcc supply rail).

FIG. 2 shows an example where coupling circuit 175 operates with a single voltage (e.g., voltage Vcc) at supply node 121. However, coupling circuit 175 can be modified such that it can also support multiple voltages (e.g., multiple supply voltages similar to supply voltage Vcc) having different values. Such multiple voltages can also be used by coupling circuit 175 (e.g., a modified coupling circuit) to cause voltage Vcc_ESD at node 122 to have different values based on operating modes of IC 101.

FIG. 3 shows a schematic diagram of clamp control circuit 155 and clamp circuit 165 of ESD protection unit 105 of FIG. 1, according to some embodiments described herein. As shown in FIG. 3, clamp circuit 165 can include transistors P8 and P9 and a buffer 315. Buffer 315 can include a pair of series-connected inverters (e.g., complementary metal-oxide-semiconductor (CMOS) inverters). During an ESD event (e.g., ESD event 123 in FIG. 1), transistors P8 and P9 can form circuit path 166 to allow ESD current to flow from node 122 to ground node 120.

Clamp control circuit 155 can include transistors P10, P11, P12, N5, N6, buffer 316, resistors R1 and R2, and capacitors C1 and C2. Resistor R1 and capacitor C1 can form an RC network to operate as an RC timer. Transistors P10, P11, resistor R1, capacitor C1 and buffers 316 and 315 can operate, such that transistor P8 is turned off in the absence of an ESD event (e.g., during normal operation of IC 101) and turned on in the presence of an ESD event. Circuit path 166 is formed between node 122 and ground node 120 when transistor P8 is turned on. After transistor P8 is turned on, it can be turned off after an amount of time has lapsed from the time it is turned on. This amount of time can be based on the RC time constant of resistor R1 and capacitor C1, which can be measured based on the rise time of a voltage at a node (e.g., timer node) 317, which is coupled to a terminal of the resistor R1 and a plate of capacitor C1.

Thus, transistors P8 and P9 are turned on when clamp circuit 165 is turned on, thereby forming circuit path 166 between node 122 and ground node 120 through transistors P8 and P9. Transistor P8 is turned off when clamp circuit 165 is turned off, thereby not forming circuit path 166 between node 122 and ground node 120.

Transistors N5, N6, P12, P10, P11, resistor R2, and capacitor C2 may be omitted from clamp control circuit 155. However, the inclusion of transistors N5, N6, P12, P10, P11, and resistor R2 can help avoid an unwanted oscillation behavior that may occur in clamp circuit 165, in which clamp circuit 165 may be turned off too soon after it is turned on in response to an ESD event. Such an oscillation may affect the operation of clamp control circuit 155 that may lead to permanent damage to IC 101, as discussed below.

The following discussion describes the operation of clamp control circuit 155 and clamp circuit 165 where transistors N5, N6, P12, P10, P11, resistor R2, and capacitor C2 are not included in clamp control circuit 155. During an ESD event, voltage Vcc_ESD at node 122 may ramp up quickly, causing clamp circuit 165 to turn on and form circuit path 166. Clamp circuit 165 yanks down voltage Vcc_ESD at node 122 through circuit path 166 to prevent damage to IC 101. For a situation where an initial DC supply voltage (e.g., Vcc) of IC 101 (FIG. 1) was previously powered up, clamp circuit 165 may yank down voltage Vcc_ESD at node 122 to a level below the initial DC voltage for that rail. Since the RC network (RC timer) formed by resistor R1 and C1 was already charged up to that DC voltage before the ESD event, this causes clamp circuit 165 to immediately time out and turn off. This causes an oscillation behavior where clamp circuit 165 may keep turning on and off. This oscillation may cause clamp circuit 165 to be insufficient to protect IC 101 from an ESD event, leading to potential permanent damage to IC 101.

The following discussion describes the operation of clamp control circuit 155 and clamp circuit 165 where clamp control circuit 155 includes transistors N5, N6, P12, P10, P11, resistor R2, capacitor C2. Transistors N5, N6, P12, P10, P11, resistor R2, capacitor C2 can form a high pass circuit to detect the sharp increase in voltage Vcc_ESD during an ESD event and discharge node 317 to ground node 120 (through transistor N6). With the configuration of clamp control circuit 155 shown in FIG. 3, clamp control circuit 155 can ignore changes in voltage Vcc_ESD of less than one Vt (the threshold voltage) and any ramp rates slower than a predetermined amount of time (e.g., 2.5 nanosecond). This prevents clamp control circuit 155 from accidently causing clamp circuit 165 to turn on (in the absence of an ESD event) during in normal operation due to power supply noise. However, during an ESD event, clamp control circuit 155 may completely discharge node 317 to ground node 120 when clamp circuit 165 turns on (e.g., discharge node 317 at the beginning of an ESD event). This ensures clamp circuit 165 to wait for the full RC time constant (e.g., one microsecond) before it turns off. Thus, the configuration of clamp control circuit 155 enables it to turn off at appropriate time in order to efficiently protect IC 101 during an ESD event.

Figure 4:
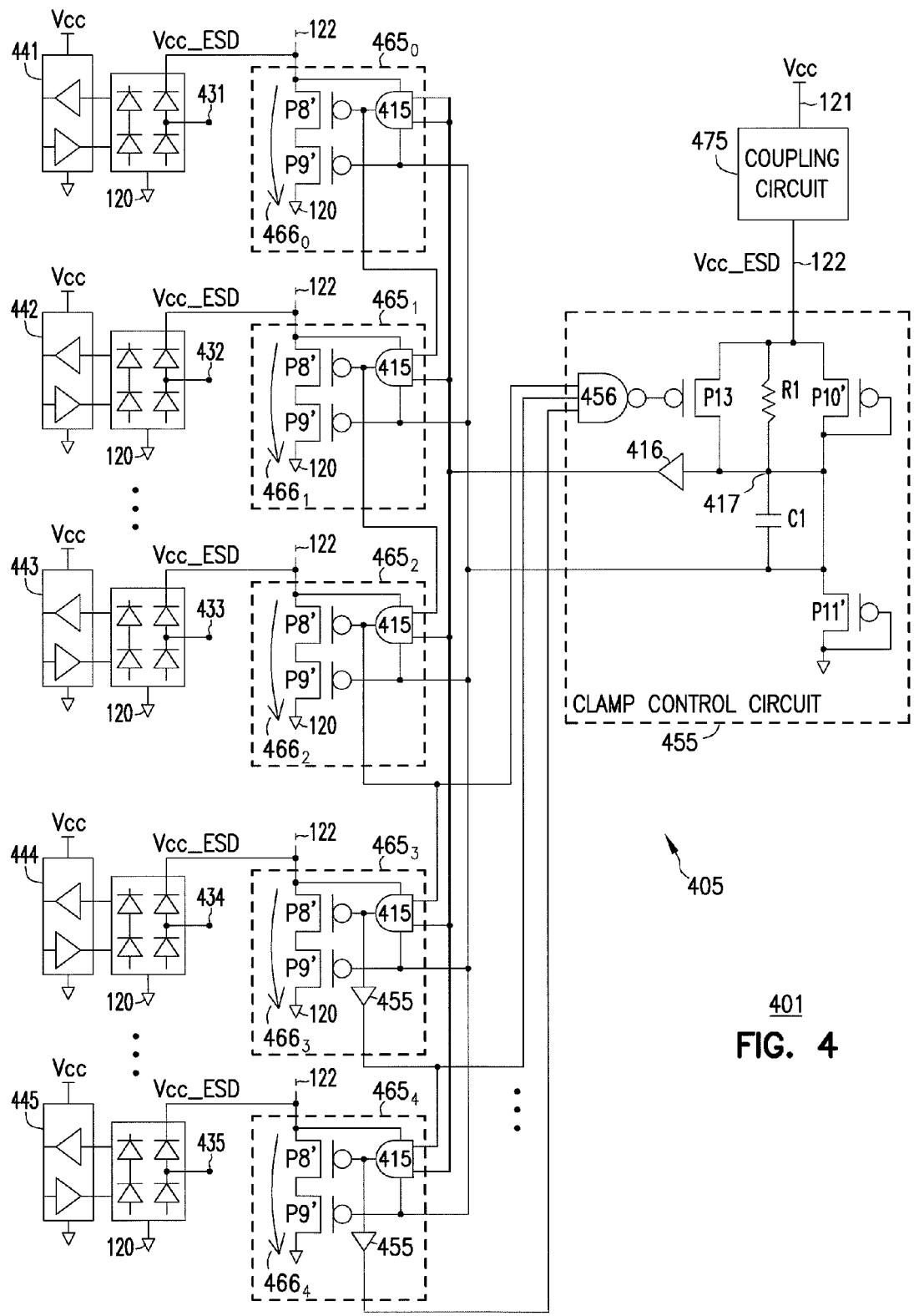
FIG. 4 shows an apparatus including an IC having an ESD protection unit that includes multiple clamp circuits, according to some embodiments described herein.

FIG. 4 shows an apparatus including an IC 401 that includes an ESD protection unit 405 with multiple clamp circuits $465_0$, $465_1$, $465_2$, $465_3$, and $465_4$, according to some embodiments described herein. IC 401 can include components similar to those of IC 101 of FIG. 1. For simplicity, similar or identical components are not repeated here. As shown in FIG. 4, IC 401 can include ground node 120, supply node 121, and node (e.g., ESD "floating" node) 122.

As described above, supply node 121 can have voltage Vcc (which can be provided on Vcc supply rail). Voltage Vcc_ESD on node 122 can have different values, depending on the operating modes of IC 401. IC 401 can include a coupling circuit 475, which can correspond to coupling circuit 175 of IC 101. Coupling circuit 475 of IC 401 can provide voltage Vcc_ESD with different values by coupling node 122 to supply node 121 through different circuit paths in coupling circuit 475. The different circuit paths can have different impedances.

IC 401 can include driver circuits 441, 442, 443, 444, and 445, each of which can include a receiver Rx and a transmitter Tx similar to each of driver circuits 141 and 142 of FIG. 1 (and FIG. 2).

ESD protection unit 405 of IC 401 can include sets of diodes (which are similar to diodes D1, D2, D3, and D4 of FIG. 1) coupled to respective nodes (e.g., I/O nodes) 431, 432, 433, 434, and 435 in ways similar to that of diodes D1, D2, D3, and D4 in FIG. 1. For simplicity, detailed connections of diodes D1, D2, D3, and D4 in FIG. 4 are not shown.

FIG. 4 shows an example where IC 401 includes five driver circuits driver circuits 441, 442, 443, 444, and 445 and their associated nodes 431, 432, 433, 434, and 435 and associated clamp circuits $465_0$, $465_1$, $465_2$, $465_3$, and $465_4$. However, the number of driver circuits and associated nodes (e.g., I/O nodes) and clamp circuits of IC 401 can vary.

As shown in FIG. 4, ESD protection unit 405 can include a clamp control circuit 455 that can operate to control (e.g., turn on and turn off) clamp circuits $465_0$, $465_1$, $465_2$, $465_3$, and $465_4$ during an ESD event. Each of clamp circuits $465_0$, $465_1$, $465_2$, $465_3$, and $465_4$ can include a logic gate (e.g., AND gate) 415, and transistors P8' and P9' (which can correspond to transistor P8' and P9' of clamp circuit 165 of FIG. 3). During an ESD event (e.g., an ESD event occurring at one or more of nodes 431, 432, 433, 434, and 435), each of clamp circuits $465_0$, $465_1$, $465_2$, $465_3$, and $465_4$ can turn on and form a respective circuit path (one of circuit paths $466_0$, $466_1$, $466_2$, $466_3$, and $466_4$) between node 122 and ground node 120 through transistors P8' and P9' in the respective clamp circuit. When a particular clamp circuit (among clamp circuits $465_0$, $465_1$, $465_2$, $465_3$, and $465_4$) is turned off, the circuit path (one of circuit path $466_0$, $466_1$, $466_2$, $466_3$, and $466_4$) in that particular clamp circuit is not formed.

Clamp control circuit 455 can include transistors P10', P11', resistor R1, capacitor C1, and a buffer 416; these components can correspond to transistors P10, P11, resistor R1, capacitor C1, and buffer 116 of clamp control circuit 155 of FIG. 3. In FIG. 4, clamp control circuit 455 can also include a keeper device (e.g., PMOS transistor) P13. Keeper device P13 can be controlled (e.g., turned on and turned off) by a logic gate (e.g., NAND gate) 456. The input nodes of logic gate 456 are provided by the output node of logic gate 415 from some of clamp circuits $465_0$, $465_1$, $465_2$, $465_3$, and $465_4$. As shown in FIG. 4, ESD protection unit 405 can include buffers (e.g., delay elements) 455, each of which can be coupled at an output of a respective logic gate 415. Buffers 455 can further slowdown signals from the output of logic gate 415 of clamp circuits $465_3$ and $465_4$ provided to input nodes of logic gate 456 of clamp control circuit 455. This allows clamp control circuit 455 to control the signal at node 417 (e.g., RC time node), such that clamp circuits $465_0$, $465_1$, $465_2$, $465_3$, and $465_4$ can be turned off in a controlled manner (e.g., turned off not too soon), thereby efficiently protecting IC 401 during an ESD event.

FIG. 4 shows an example where the output nodes of three (e.g., N=3) logic gates 415 from three corresponding clamp circuits $465_2$, $465_3$, and $465_4$ are coupled to input nodes of logic gate 456 of clamp control circuit 455. However, the output nodes of a different number of logic gates 415 (N is different from 3) can be coupled to input nodes of logic gate 456 of clamp control circuit 455.

Without logic gates 415 and logic gate 456 and their connections shown in FIG. 4, in the case of a system ESD event, when clamp circuits $465_0$, $465_1$, $465_2$, $465_3$, and $465_4$ are turned on and the ESD event is mostly over, voltage Vcc_ESD can be roughly 0V. When the RC timer of a clamp control circuit 455 expires and clamp circuits $465_0$, $465_1$, $465_2$, $465_3$, and $465_4$ turn off, voltage Vcc_ESD can rise quickly (e.g., few tenths of a nanosecond). This "fast ramp" can be interpreted by clamp control circuit 455 as another ESD event and cause clamp circuits $465_0$, $465_1$, $465_2$, $465_3$, and $465_4$ to falsely turn on.

Including logic gates 415 in clamp circuits $465_0$, $465_1$, $465_2$, $465_3$, and $465_4$ and connecting the logic gates 415 to logic gate 456 of clamp control circuit 455 allow ESD protection unit 405 to avoid an oscillation behavior. This prevents clamp circuits $465_0$, $465_1$, $465_2$, $465_3$, and $465_4$ from falsely turning on.

In ESD protection unit 405, during an ESD event, clamp circuits $465_0$, $465_1$, $465_2$, $465_3$, and $465_4$ can be concurrently turned on (e.g., turn on in parallel) for a fast response to an ESD event. However, after turning on, clamp circuits $465_0$, $465_1$, $465_2$, $465_3$, and $465_4$ can be turned off one at a time (e.g., turned off in a serial fashion, such that clamp circuits $465_0$, $465_1$, $465_2$, $465_3$, and $465_4$ are turned off at different times, one after another). This is achieved by the presence and circuit connections of logic gate 415 in each of clamp circuits $465_0$, $465_1$, $465_2$, $465_3$, and $465_4$.

As shown in FIG. 4, one of the two input nodes of logic gate 415 is controlled by (e.g., receives signal from) the timer signal (fast parallel timer signal) at node 417. This timer signal is provided in parallel to an input of logic gate 415 of clamp circuits $465_0$, $465_1$, $465_2$, $465_3$, and $465_4$. The other input node of logic gate 415 is controlled by a signal (slow serial timer signal) from the output of logic gate 415 of a preceding clamp circuit among clamp circuits $465_0$, $465_1$, $465_2$, $465_3$, and $465_4$. By staggering the turning off, especially for the last few clamp circuits $465_0$, $465_1$, $465_2$, $465_3$, and $465_4$. (e.g., by including buffers 455 as show in FIG. 4), the rise time of voltage Vcc_ESD at node 122 can be reduced. This allows the RC timer (formed by resistor R1 and capacitor C1) to keep up (because the rise time of voltage Vcc_ESD is reduced) in order to prevent clamp circuits $465_0$, $465_1$, $465_2$, $465_3$, and $465_4$ from falsely turning on. Moreover, as the number of clamp circuits $465_0$, $465_1$, $465_2$, $465_3$, and $465_4$ turning off (turning off in a serial fashion) increases, keeper device P13 gets stronger. This further reduces the RC time constant of node 417, thereby preventing oscillation behavior in ESD protection unit 405. This allows ESD protection unit 405 to efficiently protect IC 405 during an ESD event.

FIG. 4 shows an example where clamp circuits $465_0$, $465_1$, $465_2$, $465_3$, and $465_4$ can be controlled (e.g., serially turned off) using digital (e.g., logic gates) components. Alternatively, other techniques can be used. For example, an analog technique can used, such that a single analog circuit can be used in ESD protection unit 405, which can be configured to slowly ramp analog control voltage to control turning off the clamp circuit.

As described above with reference to FIG. 1 through FIG. 4, the ESD protection units (e.g., 105 and 405) can include improvements and benefits over some traditional ESD protection techniques. The clamp circuits shown in FIG. 3 and FIG. 4 (e.g., clamp circuits 165, $465_0$, $465_1$, $465_2$, $465_3$, and $465_4$) are examples of a high voltage or stacked clamp structure. Such structure can be used for cases where the supply voltage (e.g., Vcc) is larger than can be handled by a single device (e.g., large than the voltage rating (voltage tolerance) of the transistor in the stack). The stacked clamp structure allows the voltage to be divided among the multiple devices in the stack. However, other structures for the clamp circuits can be used. Furthermore, in order to not obscure the embodiments described herein, some components of ESD protection units 105 and 405 (e.g., bias details of clamp circuits 165, $465_0$, $465_1$, $465_2$, $465_3$, and $465_4$) are omitted from FIG. 3 and FIG. 4. However, one skilled in the art would readily recognize that other structure (e.g., unstacked clamp structure) can be derived from the structure of ESD protection units 105 and 405 described above with reference to FIG. 1 through FIG. 4.

Figure 5:
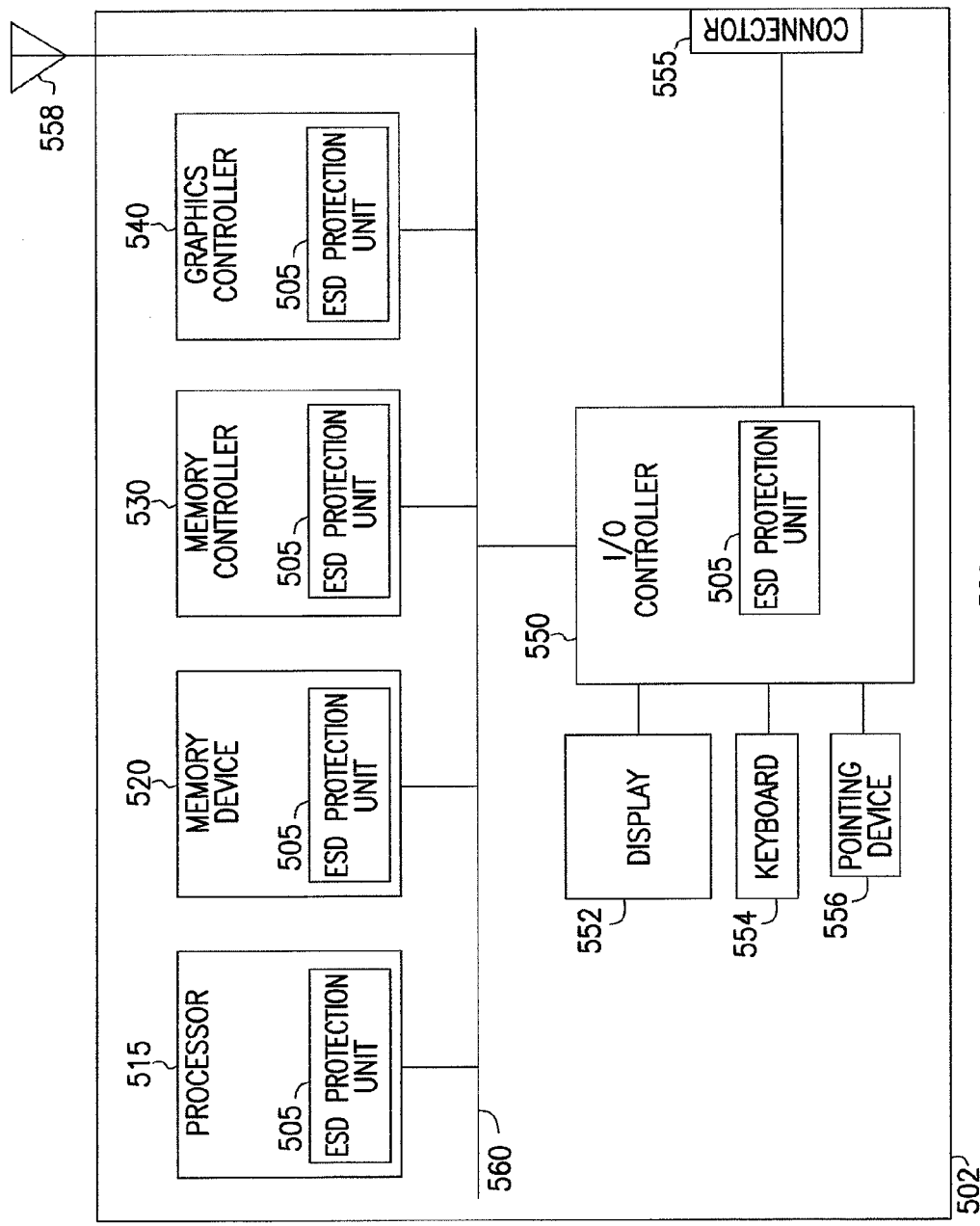
FIG. 5 shows an apparatus in the form of a system, according to some embodiments described herein.

FIG. 5 shows an apparatus in the form of a system (e.g., electronic system) 500, according to some embodiments described herein. System 500 can include or be included in a computer, a tablet, or other electronic system. As shown in FIG. 5, system 500 can include components located on a circuit board (e.g., printed circuit board (PCB)) 502, such as a processor 515, a memory device 520, a memory controller 530, a graphics controller 540, an I/O controller 550, a display 552, a keyboard 554, a pointing device 556, at least one antenna 558, a connector 555, and a bus 560. Bus 560 can include conductive lines (e.g., metal-based traces on a circuit board where the components of system 500 are located).

In some arrangements, system 500 does not have to include a display. Thus, display 552 can be omitted from system 500. In some arrangements, system 500 does not have to include any antenna. Thus, antenna 558 can be omitted from system 500. In some arrangements, system 500 does not have to include a connector. Thus, connector 555 can be omitted from system 500.

Processor 515 can include a general-purpose processor or an application specific integrated circuit (ASIC). Processor 515 can include a CPU.

Memory device 520 can include a dynamic random access memory (DRAM) device, a static random access memory (SRAM) device, a flash memory device, phase change memory, a combination of these memory devices, or other types of memory. FIG. 5 shows an example where memory device 520 is a stand-alone memory device separated from processor 515. In an alternative arrangement, memory device 520 and processor 515 can be located on the same die. In such an alternative arrangement, memory device 520 is an embedded memory in processor 515, such as embedded DRAM (eDRAM), embedded SRAM (eSRAM), embedded flash memory, or another type of embedded memory.

Display 552 can include a liquid crystal display (LCD), a touchscreen (e.g., capacitive or resistive touchscreen), or another type of display. Pointing device 556 can include a mouse, a stylus, or another type of pointing device.

I/O controller 550 can include a communication module for wired or wireless communication (e.g., communication through one or more antenna 558). Such wireless communication may include communication in accordance with WiFi communication technique, Long Term Evolution Advanced (LTE-A) communication technique, or other communication techniques.

I/O controller 550 can also include a module to allow system 500 to communicate with other devices or systems in accordance with to one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 555 can be arranged (e.g., can include terminals, such as pins) to allow system 500 to be coupled to an external device (or system). This may allow system 500 to communicate (e.g., exchange information) with such a device (or system) through connector 555. Connector 555 and at least a portion of bus 560 can include conductive lines that conform with at least one of USB, DP, HDMI, Thunderbolt, PCIe, Ethernet, and other specifications.

As shown in FIG. 5, each of processor 515, memory device 520, memory controller 530, graphics controller 540, and I/O controller 550 can include an ESD protection unit 505. ESD protection unit 505 can include any of the protection units (e.g., 105 and 405) described above with reference to FIG. 1 through FIG. 4. FIG. 5 shows each of processor 515, memory device 520, memory controller 530, graphics controller 540, and I/O controller 550 including ESD protection unit 505, as an example. However, fewer than all of processor 515, memory device 520, memory controller 530, graphics controller 540, and I/O controller 550 can include ESD protection unit 505.

FIG. 5 shows the components of system 500 arranged separately from each other as an example. For example, each of processor 515, memory device 520, memory controller 530, graphics controller 540, and I/O controller 550 can be located on a separate IC (e.g., semiconductor die or an IC chip). In some arrangements, two or more components (e.g., processor 515, memory device 520, graphics controller 540, and I/O controller 550) of system 500 can be located on the same die (e.g., same IC chip) that forms a system-on-chip.

Figure 6:
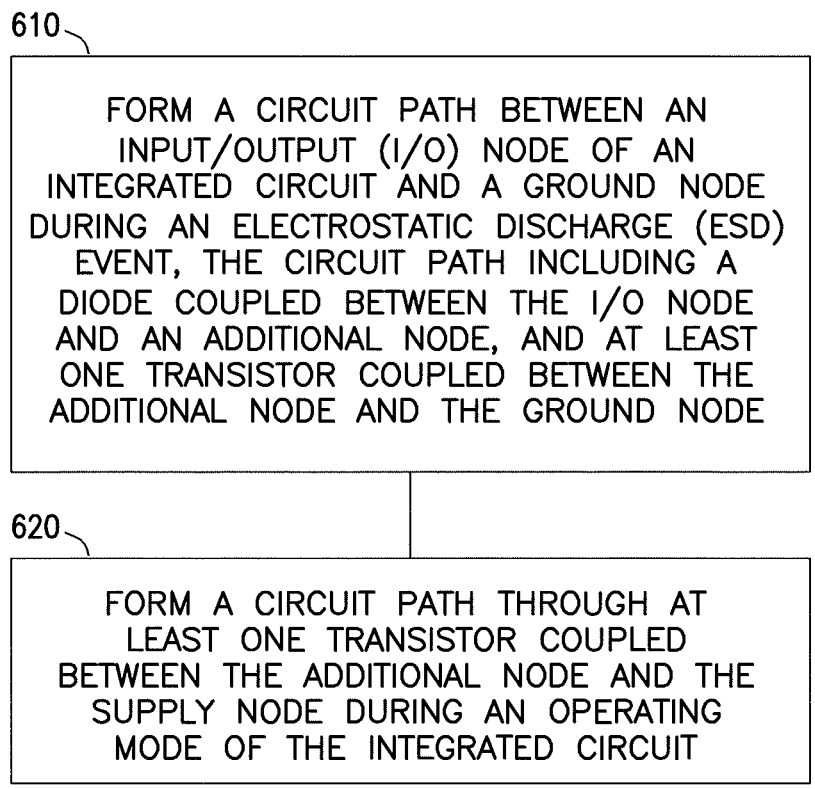
FIG. 6 is a flowchart showing a method of operating an IC, according to some embodiments described herein.

FIG. 6 is a flowchart showing a method 600 of operating an IC including an ESD protection unit, according to some embodiments described herein. The IC used in method 600 can include any of the ICs described above with reference to FIG. 1 through FIG. 5. Some of the activities in method 600 may be performed by hardware, software, firmware, or any combination of hardware, software, and firmware. Such hardware, software, and firmware can be included in the device or system that includes the IC.

As shown in FIG. 6, activity 610 of method 600 can include forming a circuit path between an I/O node of the IC and a ground node during an ESD event. The circuit path can include a diode coupled between the I/O node and an additional node, and at least one transistor coupled between the additional node and the ground node. Activity 620 can include forming a circuit path through at least one transistor coupled between the additional node and the supply node during an operating mode of the integrated circuit.

Activities 610 and 620 of method 600 may not have to be performed in the order shown in FIG. 6. For example, either activity 610 or 620 can be performed before the other activity. Further, method 600 can include fewer or more activities relative to activities 610 and 620 shown in FIG. 6. For example, method 600 can include activities and operations of any of the ESD protection units (e.g., 105, 405, and 505) described above with reference to FIG. 1 through FIG. 5.

The illustrations of the apparatuses (e.g., apparatus 100 and system 500 including IC 101, IC 401, ESD protection units 105, 405, and 505) and methods (e.g., method 600 and operations of apparatus 100 and system 400 including operations of IC 101, IC 401, ESD protection units 105, 405, and 505) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

Additional Notes and Examples

Example 1 includes subject matter (such as a device, an electronic apparatus (e.g., circuit, electronic system, or both), or a machine) including a first transistor coupled between a node and a supply node, a second transistor coupled between the node and a ground node, an electrostatic discharge (ESD) protection unit including a diode coupled between the node and an additional node, and a transistor coupled between the additional node and the supply node.

In Example 2, the subject matter of Example 1 may optionally include, wherein the ESD protection unit includes a transistor coupled between the additional node and the ground node.

In Example 3, the subject matter of Example 2 may optionally include, wherein the ESD protection unit includes an RC timer to control the transistor coupled between the additional node and the ground node.

In Example 4, the subject matter of Example 3 may optionally include, wherein the RC timer includes a resistor, and a capacitor coupled to a terminal of the resistor, and the ESD protection unit includes an additional transistor coupled between the terminal of the resistor and the ground node.

In Example 5, the subject matter of any of Examples 1-4 may optionally include, wherein the ESD protection unit includes an additional diode coupled between the node and the ground node.

In Example 6, the subject matter of any of Examples 1-4 may optionally include, further comprising an additional transistor coupled between the additional node and the supply node.

In Example 7, the subject matter any of Examples 1-4 may optionally include, wherein the apparatus comprises an integrated circuit chip, wherein the first transistor, the second transistor, the ESD protection unit, and the transistor coupled between the additional node and the supply node are located on a die of the integrated circuit chip.

Example 8 includes subject matter (such as a device, an electronic apparatus (e.g., circuit, electronic system, or both), or a machine) including an input/output (I/O) node, a supply node, and a ground node, a driver circuit including a first transistor coupled between the I/O node and the supply node, and a second transistor coupled between the I/O node and the ground node, an electrostatic discharge (ESD) protection unit including a first diode coupled between the I/O node and the ground node, a second diode coupled between the I/O node and an additional node, a clamp circuit coupled between the additional node and the ground node, and a clamp control circuit coupled to the clamp circuit, and a coupling circuit coupled between the additional node and the supply node.

In Example 9, the subject matter of Example 8 may optionally include, wherein the coupling circuit includes a transistor coupled between the additional node and the supply node.

In Example 10, the subject matter of Example 9 may optionally include, wherein the coupling circuit further includes an additional transistor coupled between the additional node and the supply node.

In Example 11, the subject matter any of Examples 8-10 may optionally include, wherein the clamp circuit includes at least one transistor coupled between the addition node and the ground node.

In Example 12, the subject matter any of Examples 8-10 optionally include, wherein the clamp control circuit includes an RC timer to provide a signal at a timer node between a resistor of the RC timer a capacitor of the RC timer.

In Example 13, the subject matter of Example 12 may optionally include, wherein the clamp circuit is to turn on during an ESD event, and the clamp control circuit is to discharge the timer node when the clamp circuit is turned on.

In Example 14, the subject matter any of Examples 8-10 may optionally include, wherein the driver circuit includes an additional transistor having a gate to receive a signal from the I/O node.

In Example 15, the subject matter any of Examples 8-10 may optionally include, wherein the coupling circuit is to cause the additional node to have a voltage having a first value based on a first operating mode of the apparatus, and to cause the additional node to have a voltage having a second value based on a second operating mode of the apparatus.

In Example 16, the subject matter any of Examples 8-10 may optionally include, wherein the ESD protection unit further includes a third diode and a fourth diode coupled between the additional node and the ground node.

Example 17 includes subject matter (such as a device, an electronic apparatus (e.g., circuit, electronic system, or both), or a machine) including a first input/output (I/O) node, a second I/O node, a first clamp circuit to turn on and form a circuit path between the first I/O node and a ground node during an electrostatic discharge (ESD) event occurred at the first I/O node, a second clamp circuit to turn on and form a circuit path between the second I/O node and the ground node during the ESD event, and a clamp control circuit to turn off the first and second clamp circuits at different times after the first and second clamp circuits are turned on.

In Example 18, the subject matter of Example 17 may optionally include, further comprising a third I/O node, a third clamp circuit to turn on and form a circuit path between the third I/O node and the ground node during the ESD event, wherein the clamp control circuit is to turn off the third clamp circuit after the third clamp circuit is turned on and after first and second clamp circuits are turned off.

In Example 19, the subject matter of Example 18 may optionally include, wherein each of the first, second, and third clamp circuits includes a logic gate, the logic gate including an input node coupled to receive a signal from the clamp control circuit.

In Example 20, the subject matter of Example 19 may optionally include, wherein the logic gate of the first clamp circuit includes an output node coupled to an input node of the logic gate of the second clamp circuit, and the logic gate of the second clamp circuit includes an output node coupled to an input node of the logic gate of the third clamp circuit.

In Example 21, the subject matter any of Examples 17-20 may optionally include, further comprising a coupling circuit, the coupling circuit including at least one transistor coupled between the additional node and the supply node.

Example 22 includes subject matter (such as a device, an electronic apparatus (e.g., circuit, electronic system, or both), or a machine) including a first integrated circuit (IC) chip on a circuit board, a second IC chip on the circuit board and coupled to the first IC chip, at least one of the first and second IC chips including a processor, and at least one of the first and second IC chips including a first transistor coupled between a node and a supply node, a second transistor coupled between the node and a ground node, an electrostatic discharge (ESD) protection unit including a diode coupled between the node and an additional node, and a transistor coupled between the additional node and the supply node, and a connector coupled to at least one of the first and second IC chips.

In Example 23, the subject matter of Example 22 may optionally include, wherein the connector conforms with one of Universal Serial Bus (USB), High-Definition Multimedia Interface (HDMI), Thunderbolt, Peripheral Component Interconnect Express (PCIe), and Ethernet specifications.

Example 24 includes subject matter (such as a method of operating a device, an electronic apparatus (e.g., circuit, electronic system, or both), or a machine) including forming a circuit path between an input/output (I/O) node of an integrated circuit and a ground node during an electrostatic discharge (ESD) event, the circuit path including a diode coupled between the I/O node and an additional node, and at least one transistor coupled between the additional node and the ground node, and forming a circuit path through at least one transistor coupled between the additional node and the supply node during an operating mode of the integrated circuit.

In Example 25, the subject matter of Example 24 may optionally include, further comprising forming an additional circuit path between an additional I/O node of the integrated circuit and the ground node during the ESD event, the additional circuit path includes an additional diode coupled between the additional I/O node and the additional node, and at least one transistor coupled between the additional node and the ground node.

In Example 26, the subject matter of Example 25 may optionally include, further comprising turning on a first clamp circuit to form the circuit path between the I/O node of the integrated circuit and the ground node, and turning on a second clamp circuit to form the additional circuit path between the additional I/O node of the integrated circuit and the ground node.

In Example 27, the subject matter of Example 26 may optionally include, further comprising turning off the first clamp circuit, and turning off the second clamp circuit after the first clamp circuit is turned off.

Example 28, includes subject matter (such as a device, an electronic apparatus (e.g., circuit, electronic system, or both), or machine) including means for performing any of the methods of Examples 24-27.

The subject matter of Example 1 through Example 28 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   a first transistor coupled between a node and a supply node, the first transistor including a gate;
   a second transistor coupled between the node and a ground node, the second transistor including a gate coupled to the gate of the first transistor;
   an electrostatic discharge (ESD) protection unit including a diode coupled between the node and an additional node;
   a transistor coupled between the additional node and the supply node;
   a first additional transistor, wherein the transistor and the first additional transistor are coupled in parallel with each other between the additional node and the supply node; and
   a second additional transistor coupled in series with the first additional transistor between the additional node and the supply node the second additional transistor including a gate coupled to a node between the first additional transistor and the second additional transistor.

2. The apparatus of claim 1, wherein the ESD protection unit includes a transistor coupled between the additional node and the ground node.

3. The apparatus of claim 2, wherein the ESD protection unit includes an RC tuner to control the transistor coupled between the additional node and the ground node.

4. The apparatus of claim 3, wherein the RC timer includes a resistor, and a capacitor coupled to a terminal of the resistor, and the ESD protection unit includes an additional transistor coupled between the terminal of the resistor and the ground node.

5. The apparatus of claim 1, wherein the ESD protection unit includes an additional diode coupled between the node and the ground node.

6. The apparatus of claim 1, wherein the apparatus comprises an integrated circuit chip, wherein the first transistor, the second transistor, the ESD protection unit, and the transistor coupled between the additional node and the supply node are located on a die of the integrated circuit chip.

7. An apparatus comprising:
an input/output (I/O) node, a supply node, and a ground node;
a driver circuit including a first transistor coupled between the I/O node and the supply node, and a second transistor coupled between the I/O node and the ground node, the first transistor including a gate coupled to a gate of the second transistor;
an electrostatic discharge (ESD) protection unit including a first diode coupled between the I/O node and the ground node, a second diode coupled between the I/O node and an additional node, a clamp circuit coupled between the additional node and the ground node, and a clamp control circuit coupled to the clamp circuit; and
a coupling circuit coupled between the additional node and the supply node including:
a transistor coupled between the additional node and the supply node;
a first additional transistor, wherein the transistor and the first additional transistor are coupled in parallel with each other between the additional node and the supply node; and a second additional transistor coupled in series with the first additional transistor between the additional node and the supply node, the second additional transistor including a gate coupled to a node between the first additional transistor and the second additional transistor, wherein the ESD protection unit further includes a third diode and a fourth diode coupled between the additional node and the ground node, wherein:
the first diode includes an anode coupled to the ground node, and a cathode coupled to the I/O node;
the second diode includes an anode coupled to the I/O node, and a cathode coupled to the additional node;
the third diode includes an anode coupled to the ground node; and
the fourth diode includes a cathode coupled to the additional node.

8. The apparatus of claim 7, wherein the clamp circuit includes at least one transistor coupled between the additional node and the ground node.

9. The apparatus of claim 7, wherein the clamp control circuit includes an RC timer to provide a signal at a timer node between a resistor of the RC timer a capacitor of the RC timer.

10. The apparatus of claim 9, wherein the clamp circuit is to turn on during an ESD event, and the clamp control circuit is to discharge the timer node when the clamp circuit is turned on.

11. The apparatus of claim 7, wherein the driver circuit includes an additional transistor having a gate to receive a signal from the I/O node.

12. The apparatus of claim 7, wherein the coupling circuit is to cause the additional node to have a voltage having a first value based on a first operating mode of the apparatus, and to cause the additional node to have a voltage having a second value based on a second operating mode of the apparatus.

13. An apparatus comprising:
a first input/output (I/O) node;
a second I/O node;
a first clamp circuit to turn on and form a circuit path between the first I/O node and a ground node during an electrostatic discharge (ESD) event occurred at the first I/O node;
a second clamp circuit to turn on and form a circuit path between the second I/O node and the ground node during the ESD event; and
a clamp control circuit to turn off the first and second clamp circuits at different times after the first and second clamp circuits are turned on.

14. The apparatus of claim 13, further comprising:
a third I/O node;
a third clamp circuit to turn on and form a circuit path between the third I/O node and the ground node during the ESD event, wherein the clamp control circuit is to turn off the third clamp circuit after the third clamp circuit is turned on and after first and second clamp circuits are turned off.

15. The apparatus of claim 14, wherein each of the first, second, and third clamp circuits includes a logic gate, the logic gate including an input node coupled to receive a signal from the clamp control circuit.

16. The apparatus of claim 15, wherein the logic gate of the first clamp circuit includes an output node coupled to an input node of the logic gate of the second clamp circuit, and the logic gate of the second clamp circuit includes an output node coupled to an input node of the logic gate of the third clamp circuit.

17. The apparatus of claim 13, further comprising a coupling circuit, the coupling circuit including at least one transistor coupled between the clamp control circuit and a supply node.

18. An apparatus comprising:
a first integrated circuit (IC) chip on a circuit board;
a second IC chip on the circuit board and coupled to the first IC chip, at least one of the first and second IC chips including a processor; and at least one of the first and second IC chips including:
a first transistor coupled between a node and a supply node, the first transistor including a gate;
a second transistor coupled between the node and a ground node, the second transistor including a gate coupled to the gate of the first transistor;
an electrostatic discharge (ESD) protection unit including a diode coupled between the node and an additional node;
a transistor coupled between the additional node and the supply node;

a first additional transistor, wherein the transistor and the first additional transistor are coupled in parallel with each other between the additional node and the supply node; and a second additional transistor coupled in series with the first additional transistor between the additional node and the supply node, the second additional transistor including a gate coupled to a node between the first additional transistor and the second additional transistor; and a connector coupled to at least one of the first and second IC chips.

19. The apparatus of claim 18, wherein the connector conforms with one of Universal Serial Bus (USB), High-Definition Multimedia Interface (HDMI), Thunderbolt, Peripheral Component Interconnect Express (PCIe), and Ethernet specifications.

* * * * *

UNITED STATES PATENT AND TRADEMARK OFFICE
CERTIFICATE OF CORRECTION

PATENT NO. : 10,373,948 B2  
APPLICATION NO. : 15/203296  
DATED : August 6, 2019  
INVENTOR(S) : Mozak et al.

Page 1 of 1

It is certified that error appears in the above-identified patent and that said Letters Patent is hereby corrected as shown below:

In the Claims

In Column 14, Line 64, in Claim 1, delete "node" and insert --node,-- therefor

In Column 15, Line 5, in Claim 3, delete "tuner" and insert --timer-- therefor

In Column 16, Line 56, in Claim 18, delete "processor;" and insert --processor,-- therefor Signed and Sealed this  
Fourth Day of January, 2022

Drew Hirshfeld  
*Performing the Functions and Duties of the*  
*Under Secretary of Commerce for Intellectual Property and*  
*Director of the United States Patent and Trademark Office*